(12) United States Patent
Wang et al.

(10) Patent No.: US 9,159,629 B2
(45) Date of Patent: Oct. 13, 2015

(54) HIGH PERFORMANCE CMOS DEVICE DESIGN

(71) Applicant: Taiwan Semiconductor Manufacturing Company, Ltd., Hsin-Chu (TW)

(72) Inventors: Chih-Hao Wang, Baoshan Township (TW); Shang-Chih Chen, Jiadong Township (TW); Ching-Wei Tsai, Taoyuan (TW); Ta-Wei Wang, Taipei (TW); Pang-Yen Tsai, Jhu-Bei (TW)

(73) Assignee: Taiwan Semiconductor Manufacturing Company Ltd., Hsin-Chu (TW)

( * ) Notice: Subject to any disclaimer, the term of this patent is extended or adjusted under 35 U.S.C. 154(b) by 0 days.

(21) Appl. No.: 13/961,656

(22) Filed: Aug. 7, 2013

(65) Prior Publication Data

US 2013/0323899 A1    Dec. 5, 2013

Related U.S. Application Data

(60) Division of application No. 12/330,961, filed on Dec. 9, 2008, now Pat. No. 8,507,951, which is a continuation of application No. 11/115,484, filed on Apr. 27, 2005, now Pat. No. 7,465,972.

(60) Provisional application No. 60/645,649, filed on Jan. 21, 2005.

(51) Int. Cl.
*H01L 21/8238*    (2006.01)
*H01L 29/10*    (2006.01)
*H01L 29/66*    (2006.01)

(52) U.S. Cl.
CPC  *H01L 21/823814* (2013.01); *H01L 21/823807* (2013.01); *H01L 29/1054* (2013.01); *H01L 29/66636* (2013.01)

(58) Field of Classification Search
CPC ..................... H01I 21/8238; H01I 21/823814
USPC ......................................................... 438/300
See application file for complete search history.

(56) References Cited

U.S. PATENT DOCUMENTS 6,492,216 B1    12/2002 Yeo et al.
6,600,170 B1    7/2003 Xiang (Continued)

OTHER PUBLICATIONS

Yin, H., et al., "Fully-Depleted Strained-Si on Insulator NMOSFETs without Relaxed SiGe Buffers," IDEM, 2003, pp. 53.56.

(Continued)

*Primary Examiner* — Matthew Reames
(74) *Attorney, Agent, or Firm* — Slater & Matsil, L.L.P.

(57) ABSTRACT

A semiconductor device includes a gate, which comprises a gate electrode and a gate dielectric underlying the gate electrode, a spacer formed on a sidewall of the gate electrode and the gate dielectric, a buffer layer having a first portion underlying the gate dielectric and the spacer and a second portion adjacent the spacer wherein the top surface of the second portion of the buffer layer is recessed below the top surface of the first portion of the buffer layer, and a source/drain region substantially aligned with the spacer. The buffer layer preferably has a greater lattice constant than an underlying semiconductor substrate. The semiconductor device may further include a semiconductor-capping layer between the buffer layer and the gate dielectric, wherein the semiconductor-capping layer has a smaller lattice constant then the buffer layer.

20 Claims, 9 Drawing Sheets

(56) References Cited

U.S. PATENT DOCUMENTS

| | | |
|---|---|---|
| 6,730,551 B2 | 5/2004 | Lee et al. |
| 6,847,093 B2 | 1/2005 | Ichinose et al. |
| 6,881,635 B1 | 4/2005 | Chidambarrao et al. |
| 6,882,025 B2 | 4/2005 | Yeo et al. |
| 7,227,205 B2 | 6/2007 | Bryant et al. |
| 7,238,555 B2 | 7/2007 | Orlowski et al. |
| 7,301,205 B2 | 11/2007 | Matsumori |
| 7,452,784 B2 | 11/2008 | Henson et al. |
| 7,465,972 B2 | 12/2008 | Wang et al. |
| 7,575,975 B2 | 8/2009 | Thean et al. |
| 2002/0076899 A1 | 6/2002 | Skotnicki et al. |
| 2002/0190284 A1 | 12/2002 | Murthy et al. |
| 2003/0162348 A1 | 8/2003 | Yeo et al. |
| 2003/0227072 A1 | 12/2003 | Forbes et al. |
| 2004/0026765 A1 | 2/2004 | Currie et al. |
| 2004/0175872 A1 | 9/2004 | Yeo et al. |
| 2004/0227185 A1* | 11/2004 | Matsumoto et al. .......... 257/347 |
| 2005/0045905 A1 | 3/2005 | Chu et al. |
| 2005/0090048 A1 | 4/2005 | Kreps |
| 2005/0093021 A1* | 5/2005 | Ouyang et al. ............... 257/194 |
| 2005/0242340 A1 | 11/2005 | Chidambarrao et al. |
| 2006/0172477 A1 | 8/2006 | Shima |
| 2006/0172500 A1 | 8/2006 | Yang et al. |
| 2007/0032003 A1 | 2/2007 | Zhang et al. |
| 2007/0099353 A1 | 5/2007 | Thean et al. |
| 2007/0134859 A1 | 6/2007 | Curello et al. |
| 2007/0202561 A1 | 8/2007 | Rosenstein |
| 2007/0202651 A1 | 8/2007 | Zhang et al. |
| 2008/0169515 A1 | 7/2008 | Hwang |

OTHER PUBLICATIONS

Yeo, Y.-C. et al., "Enhanced Performance in Sub-100 nm CMOSFETs Using Strained Exptaxial Silicon-Germanum," IEDM, 2000, pp. 753-756.

Nayak, D.K., et al., "Enhancement-Mode Quantum-Well GexSi1-x PMOS," IEEE Electron Device Letters, vol. 12, No. 4, Apr. 1991, pp. 154-156.

Ismail, K. et al., "Electron Transport Properties of Si/SiGe Heterostructures: Measurements and Device Implications," Appl. Phys. Lett., vol. 63, No. 5, Aug. 2, 1993, pp. 660-662.

Kawasaki, H. et al., "Impact of Parasitic Resistance aned Silicon Layer Thickness Sealing for Strained-Silicon MOSFETs on Relaxed Si1-xGex Virtual Substrate," IEEE 2004, 4 pages.

* cited by examiner

US 9,159,629 B2

HIGH PERFORMANCE CMOS DEVICE DESIGN

This application is a continuation of U.S. patent application Ser. No. 12/330,961, filed Dec. 9, 2008, and entitled "High Performance CMOS Device Design," which application is a divisional of U.S. patent application Ser. No. 11/115,484, filed Apr. 27, 2005, and entitled "High Performance CMOS Device Design," which application further claims priority to U.S. Provisional Patent Application No. 60/645,649, filed Jan. 21, 2005, and entitled "High Performance CMOS Device Design," which applications are hereby incorporated herein by reference.

TECHNICAL FIELD

This invention relates generally to semiconductors, and more specifically to CMOS devices with strained channel regions.

BACKGROUND

The scaling of VLSI circuits is a constant effort. With circuits become smaller and faster, device driving current improvement becomes more important. Device current is closely related to gate length, gate capacitance, and carrier mobility. Shortening poly-gate length, increasing gate capacitance and increasing carrier mobility can improve the device current performance. Gate length reduction is an ongoing effort in order to shrink circuit size. Increasing gate capacitance has also been achieved by efforts such as reducing gate dielectric thickness, increasing gate dielectric constant, and the like. In order to further improve device current, enhancing carrier mobility has also been explored.

Among efforts made to enhance carrier mobility, forming a strained silicon channel is a known practice. Strain can enhance bulk electron and hole mobility. The performance of a MOS device can be enhanced through a strained-surface channel. This technique allows performance to be improved at a constant gate length, without adding complexity to circuit fabrication or design.

When silicon is placed under strain, the in-plane, room temperature electron mobility is dramatically increased. One way to develop strain is by using a graded SiGe epitaxy layer as a substrate on which a layer of relaxed SiGe is formed. A layer of silicon is formed on the relaxed SiGe layer. MOS devices are then formed on the silicon layer, which has inherent strain. Since the lattice constant of SiGe is larger than that of Si, the Si film is under biaxial tension and thus the carriers exhibit strain-enhanced mobility.

Strain in a device may have components in three directions; parallel to the MOS device channel length, parallel to the device channel width, and perpendicular to the channel plane. The strains parallel to the device channel length and width are called in-plane strains. Research has revealed that bi-axial, in-plane tensile strain can improve nMOS performance, and compressive strain parallel to the channel length direction can improve pMOS device performance.

What is needed, then, are methods for improving device performance by promoting tensile strain in nMOS devices and compressive strain in pMOS devices.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The intermediated stages of manufacturing a preferred embodiment of the present disclosure are illustrated. Throughout the various views and illustrative embodiments of the present disclosure, like reference numbers are used to designate like elements. Each figure number may be followed by a letter indicating variations of the same structure or process step.

Figure 1:
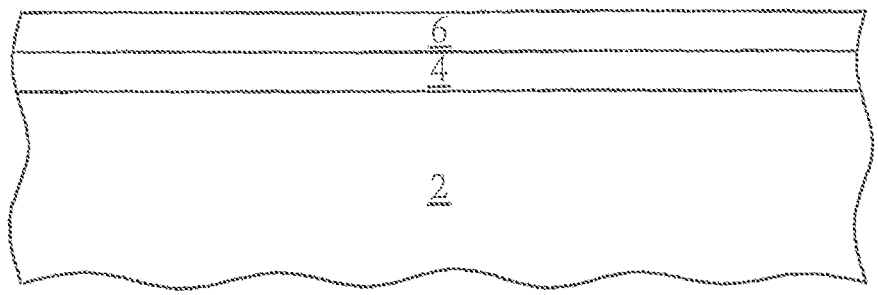
FIGS. 1 through 5D are cross-sectional views of intermediate stages in the manufacture of a preferred embodiment of the present disclosure.

FIG. 1 illustrates stacked layers 2, 4 and 6. Substrate 2 is preferably a semiconductor material, and more preferably, a silicon substrate. Substrate 2 can be in the form of bulk silicon or in a well-known silicon-on-insulator (SOI) structure, with a layer of silicon formed on an insulating layer such as a buried oxide layer (BOX).

A buffer layer 4 is formed, preferably epitaxially grown, on the substrate 2. The buffer layer 4 is preferably a semiconductor having a greater lattice constant than the substrate 2. In the preferred embodiment, the buffer layer 4 comprises silicon and germanium. For simplicity, it is equally referred to as the SiGe layer 4, although other materials can be used. In other embodiments, the buffer layer 4 comprises silicon, germanium and carbon. The preferred thickness of the buffer layer 4 is between about 2 nm and about 50 nm.

An optional semiconductor-capping layer 6 is formed, preferably epitaxially grown, on the buffer layer 4. The semiconductor-capping layer 6 preferably has a lattice constant smaller than the lattice constant of the buffer layer 4. In the preferred embodiment, it is formed of silicon. In other embodiments, it comprises materials such as silicon, germanium, and the like, and the germanium concentration is preferably less than in the buffer layer 4, so that its overall lattice constant is smaller than that of the buffer layer 4. The semiconductor-capping layer 6 is also referred to as silicon-capping layer 6 although it may comprise other materials. The thickness of the semiconductor-capping layer 6 for pMOS devices is preferably less than for nMOS devices. Different thicknesses can preferably be achieved by two methods: (1) forming the semiconductor-capping layer 6 for both pMOS and nMOS devices, and then reducing the thickness for pMOS devices; or (2) forming the semiconductor-capping layer 6 for both pMOS and nMOS devices to a first thickness, masking pMOS devices, and further forming the capping layer for the nMOS devices to a second thickness. In regions where pMOS devices are to be formed, the semiconductor-capping layer 6 preferably has a thickness of between about 0.5 nm and about 20 nm. In regions where nMOS devices are to be formed, the semiconductor-capping layer 6 preferably has a thickness of between about 0.6 nm and about 25 nm.

Figure 2:
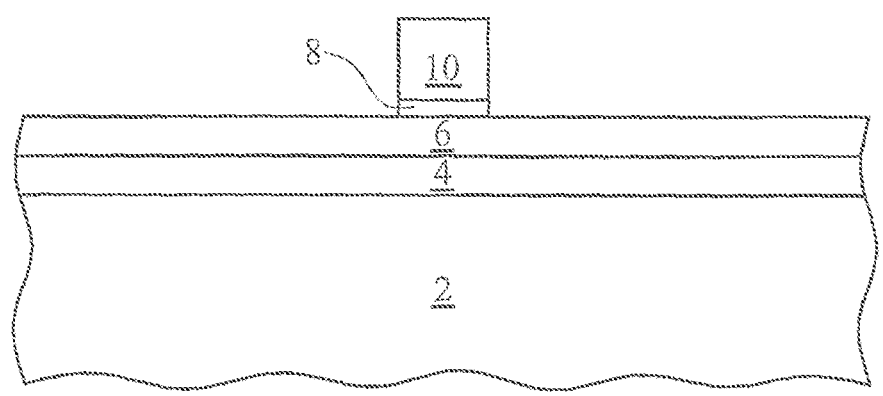

Gate dielectric 8 and gate electrode 10 are then formed, as illustrated in FIG. 2. A gate dielectric layer is formed on the capping layer 6, followed by a gate electrode layer. These layers are then patterned and etched to form gate dielectric 8 and gate electrode 10. In the preferred embodiment, gate dielectric 8 comprises $SiO_2$, and may be referred to as gate oxide 8. In other embodiments, gate dielectric 8 is formed of oxynitride, nitride, high-k materials, and the like. Gate electrode 10 is preferably polysilicon, although it may be formed of other commonly used materials such as metal, metal silicide, and the like.

Figure 3:
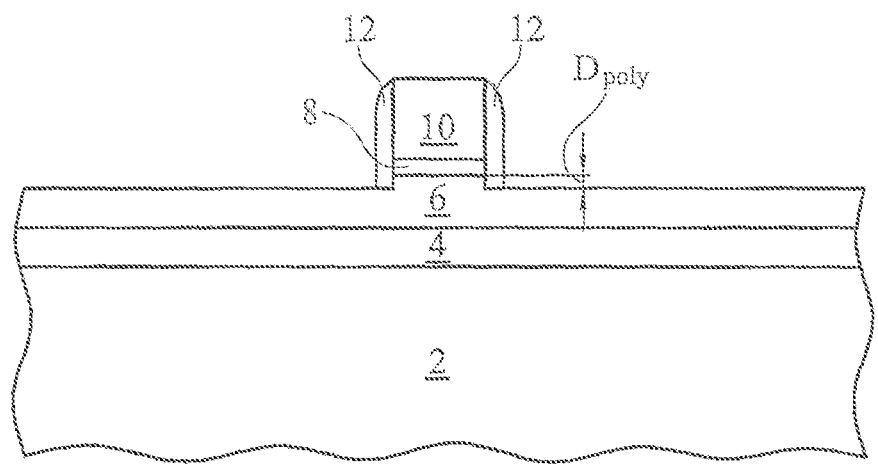

FIG. 3 illustrates a pair of spacers 12 formed along the sidewalls of the gate dielectric 8 and gate electrode 10. Spacers 12 serve as self-aligning masks for subsequent source/drain formation steps, as will be described hereinafter. The spacers 12 may be formed by well-known methods such as blanket depositing a dielectric layer over the entire region, then anisotropically etching to remove the dielectric from the horizontal surfaces and leaving spacers 12. It is to be noted that while patterning the gate dielectric 8 and gate electrode 10, over etching may occur due to process deviations, so that spacers 12 extend into the semiconductor-capping layer 6. As a result, the tensile strain in the semiconductor-capping layer 6 is also reduced and the device performance improvement is less than expected. Therefore, it is preferred that the over etching depth $D_{poly}$ in the semiconductor capping layer 6 is less than about 30 nm.

Figure 4A:
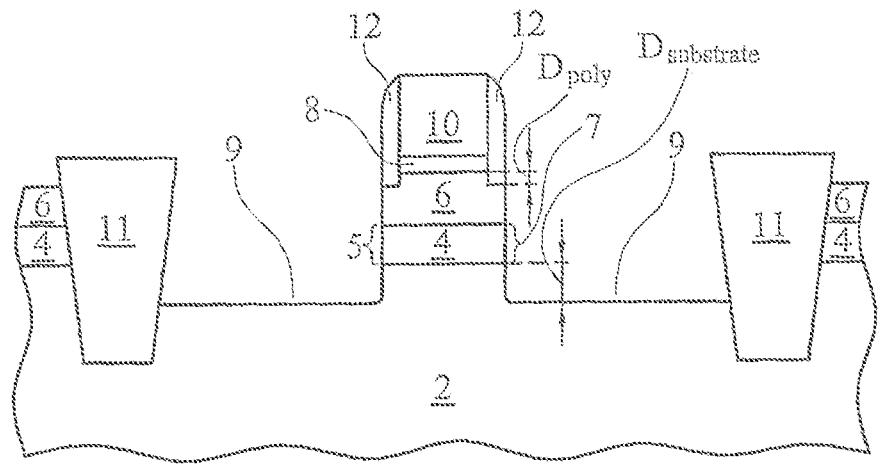
Figure 4B:
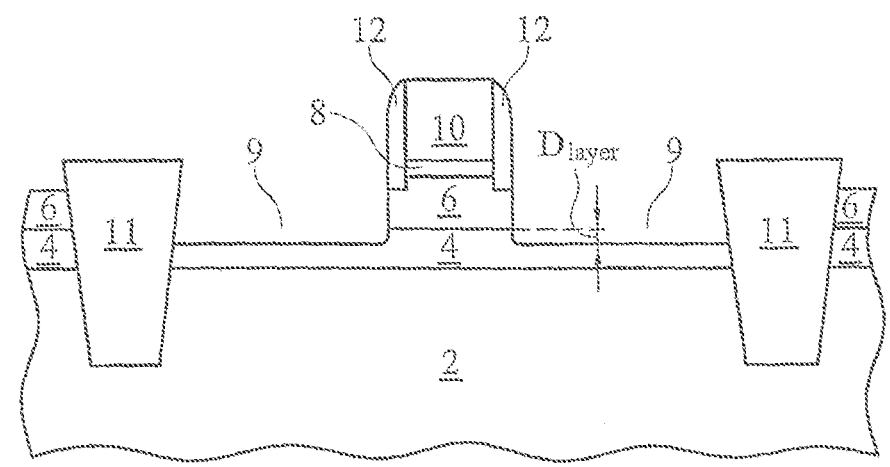

Recesses 9 are then formed along the gate spacers 12, as illustrated in FIGS. 4A and 4B. In the preferred embodiments, as illustrated in FIG. 4A, recesses 9 extend through the semiconductor-capping layer 6 and buffer layer 4 and into the substrate 2. The recess depth $D_{substrate}$ in the substrate 2 is preferably less than about 50 nm. Free surfaces 5 and 7 are created on sidewalls of the buffer layer 4. When "free surface" is referred to, it should be interpreted that there is substantially no material covering it at the time of annealing, so that the material under the free surface is free to expand or contract to its greatest capacity, although in the final structure, the free surface is covered with materials such as inter-layer dielectrics. When the buffer layer 4 is annealed, the buffer layer 4 tends to relax and restore its lattice structure and thus will expand. The free surfaces 5 and 7 allow the buffer layer 4 to expand freely. In subsequent annealing processes, the buffer layer 4 can be expanded toward the left of the free surface 5 and the right of the free surface 7. Due to force balance effects and free surface effects, compressive strain will be generated in the buffer layer 4, and tensile strain will be generated in the semiconductor-capping layer 6. In the preferred embodiment, two free surfaces 5 and 7 are available for buffer layer 4 to expand. In alternative embodiments, recessing 9 is formed only on one side of the gate 8 and 10 and only one of the free surfaces 5 and 7 exists. When annealed, the buffer layer 4 will expand substantially in one direction.

Figure 4C:
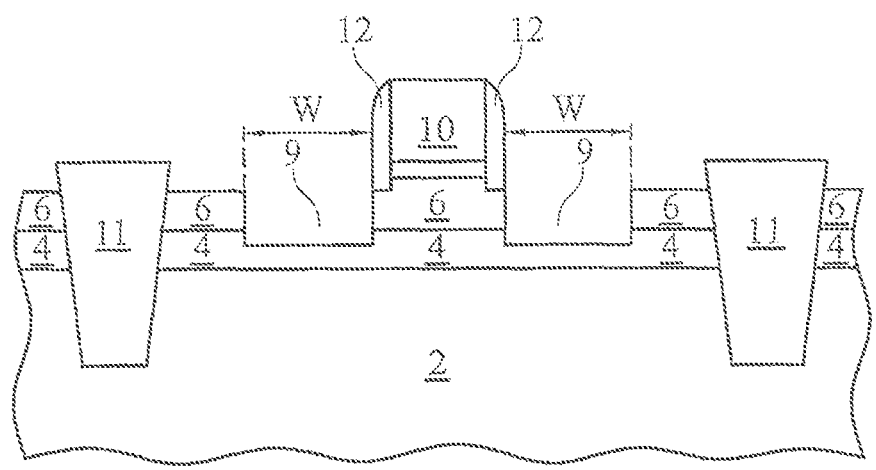

FIGS. 4A and 4B illustrate a preferred embodiment where the recesses 9 extend from an outer edge of the spacer 12 to respective shallow trench isolations (STI) 11. In alternative embodiments, as shown in FIG. 4C, recesses 9 have a width W smaller than the distance between an outer edge of the spacers 12 and respective STI 11. Width W is preferably great enough for the buffer layer 4 to expand when annealed.

Compressive strain can also be generated even though sidewalls of the buffer layer 4 are not fully exposed. In alternative embodiments, as shown in FIG. 4B, the capping layer 6 is etched through while buffer layer 4 is partially recessed. Recesses 9 have a depth $D_{layer}$ in the buffer layer. For pMOS devices, the depth $D_{layer}$ is preferably between about 0 nm and about 50 nm, and more preferably between about 0 nm and about 20 nm. For nMOS devices, the recess depth $D_{layer}$ is between about 2 nm and 50 nm, and more preferably between about 2 nm and about 20 nm.

Due to process variations, it is possible that the recess formation is not uniform for nMOS devices and pMOS devices. While the nMOS devices have recesses extending into the buffer layer 4, pMOS devices may only have recesses extending into the semiconductor-capping layer 6 without further extending into the buffer layer 4.

Source and drain regions 14 are then formed, as illustrated in FIGS. 5A through 5D. In the preferred embodiment, source and drain regions 14 are formed by doping on either side of gate spacers 12. In other embodiments, source/drain regions may be formed by recessing exposed semiconductor materials using spacers 12 as masks, and epitaxially growing semiconductor material (along with desired impurities) in the recesses.

Figure 5A:
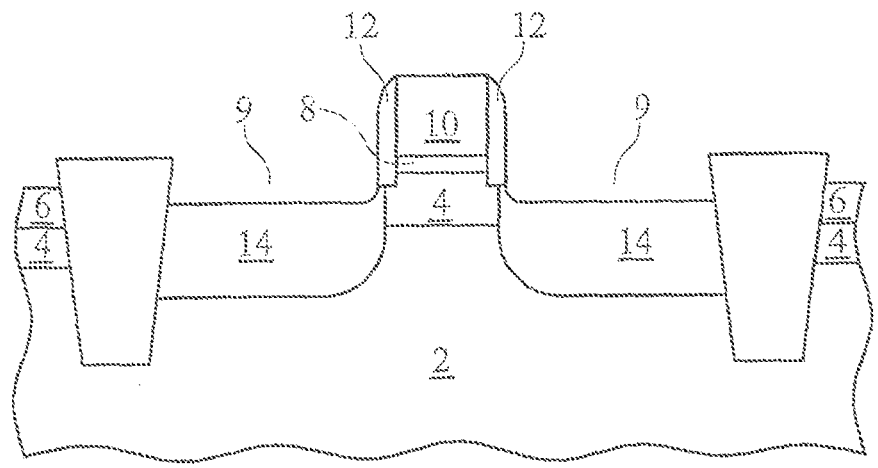
Figure 5B:
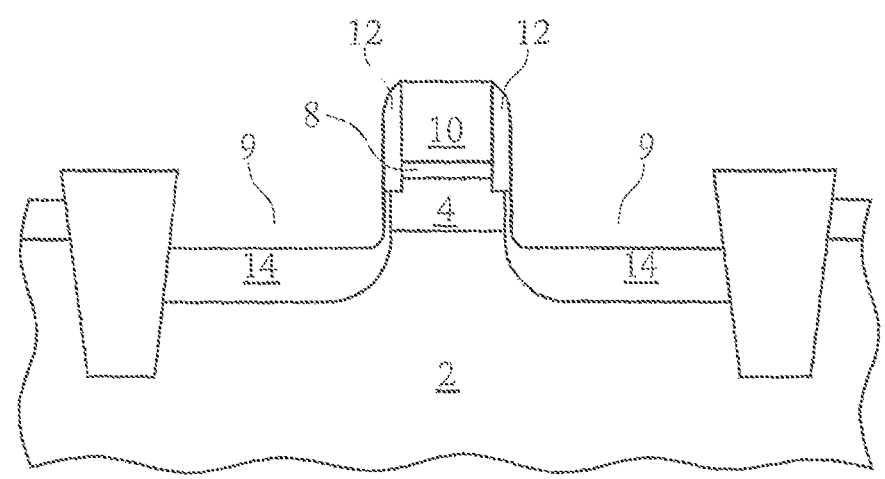
Figure 5C:
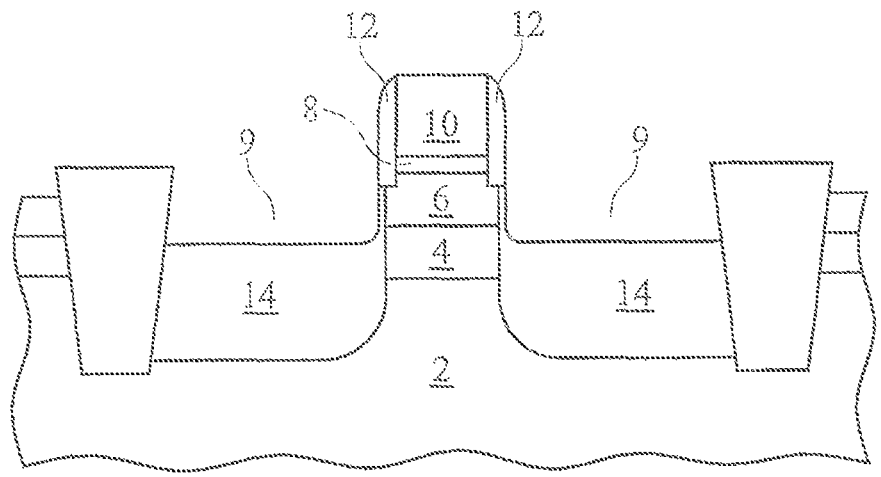
Figure 5D:
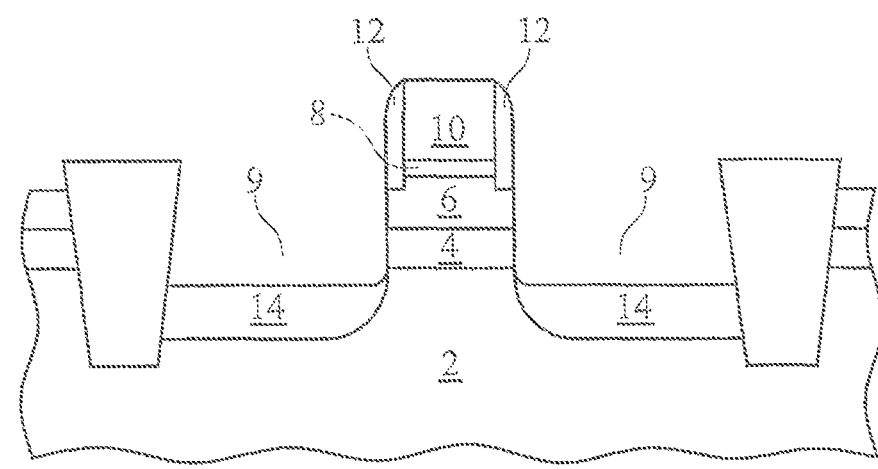

Through previously discussed processes, several variations of the preferred embodiment can be formed. In FIGS. 5A and 5B, there is no semiconductor-capping layer 6 formed, and recesses 9 may be formed entirely in the buffer layer 4, as shown in FIG. 5A, or extending into the substrate 2, as shown in FIG. 5B. Preferably, embodiments shown in FIGS. 5A and 5B are suitable for pMOS devices wherein compressive stress is desired. In FIGS. 5C and 5D, the semiconductor-capping layer 6 is formed on the buffer layer 4. Similar to the embodiments referenced in FIGS. 5A and 5B, recesses 9 may be formed entirely in the semiconductor-capping layer 6 and the buffer layer 4, as shown in FIG. 5C, or extending into the substrate 2, as shown in FIG. 5D. For pMOS devices, recesses 9 are preferably formed in the semiconductor-capping layer 6 without extending into the buffer layer 4.

Figure 6A:
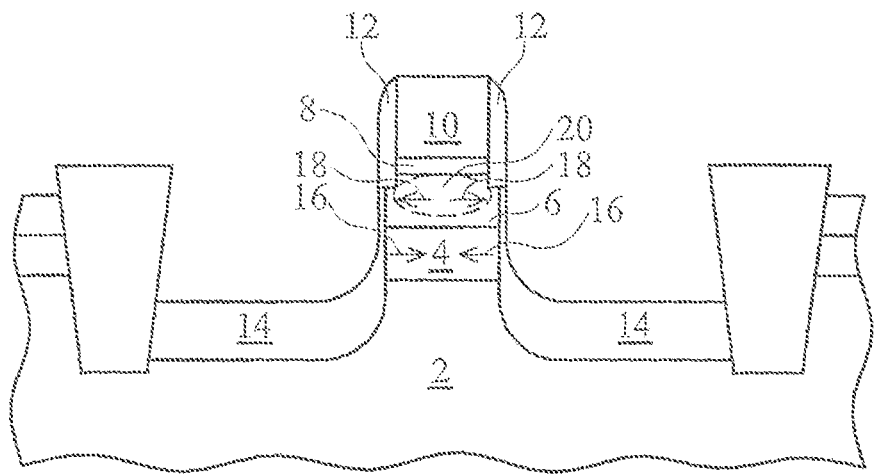
FIGS. 6A through 6C are schematic views of the respective channels of an nMOS device and a pMOS device.
Figure 6B:
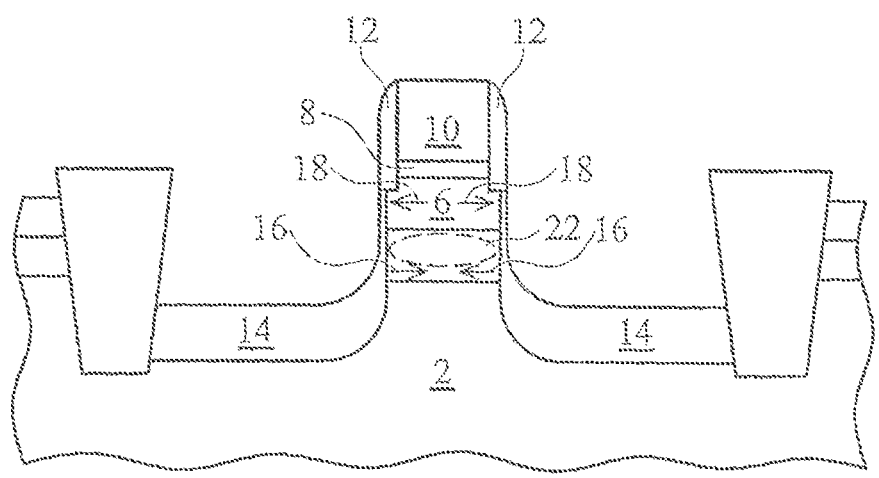
Figure 6C:
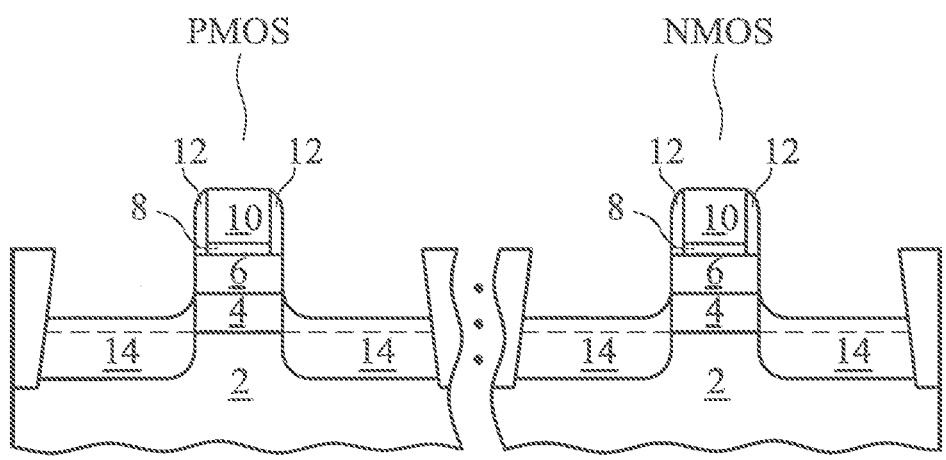

FIG. 6A and 6B schematically illustrate strains 16 and 18 in the buffer layer 4 and semiconductor-capping layer 6, respectively. Buffer layer 4 has a compressive strain, as symbolized by arrows 16, mainly due to the smaller lattice constant of the substrate 2. The semiconductor-capping layer 6 has a tensile strain, as symbolized by arrows 18, due to the greater lattice constant of the buffer layer 4. FIGS. 6A and 6B also schematically illustrate the channels 20 and 22 of nMOS and pMOS devices, respectively. In an nMOS device, channel region 20 is substantially within the semiconductor-capping layer 6. Since the capping layer 6 has an inherent tensile strain, the performance of the nMOS devices is improved. For pMOS devices, the addition of germanium causes the valence band to be lower. For example, if germanium concentration is from about 10% to about 30%, the valence band will be about 100 mV to about 300 mV lower, thus the channel region 22 of a pMOS device tends to be in the SiGe layer 4 rather than in silicon capping layer 6. Therefore, channel regions of pMOS devices have compressive strains, and the device performance is improved. The nMOS device as shown in FIG. 6A and the pMOS device as shown in FIG. 6B may be formed on a same substrate 2, as shown in FIG. 6C.

In a pMOS device, the buffer layer preferably uses SiGe, however, if SiGe directly touches the gate oxide 8, there may be reliability issues. Therefore, a thin silicon-capping layer 6 is preferred between the SiGe layer 4 and gate oxide 8. If other materials are used as the gate dielectric, such as nitride or high-K dielectric materials, the thin silicon-capping layer 6 can be omitted and the resulting structure is shown in FIGS. 5A and 5B.

The preferred embodiments have hybrid strains, with tensile strain in the semiconductor-capping layer 6 and compressive strain in the buffer layer 4. With the hybrid strains, device performance is improved for both nMOS and pMOS devices.

Figure 7:
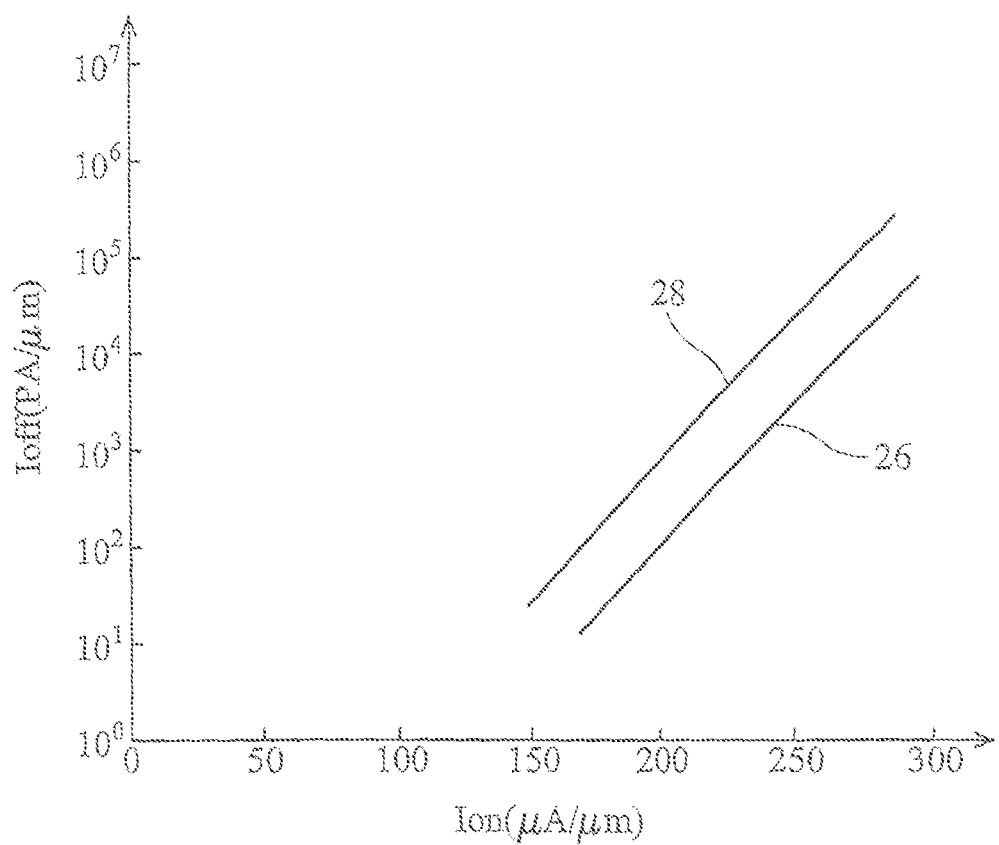
FIG. 7 illustrates off-state leakage current as the function of drive current.

FIG. 7 illustrates the devices' leakage current in an off-state (off-current) as the function of drive current (on-current). The exemplary results shown are obtained on pMOS sample devices. Line 26 illustrates a result obtained from a preferred embodiment having both the semiconductor-capping layer and the buffer layer, while line 28 illustrates a result obtained from a pMOS device formed on bulk silicon. It is noted that at a same off-current, the preferred embodiment has an on-current of about 15 percent higher than the device formed on bulk silicon. The exemplary results from nMOS (not shown) also indicate more than about 10 percent improvement. Experiments also revealed that there is improvement in $I_{on}$-$I_{off}$ characteristics of the device, with no substantial degradation found in other characteristics.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

Several advantageous method embodiments are within the scope of the present disclosure. These include but are not limited to the following: A method of forming a semiconductor device comprises forming on the substrate a buffer layer having a lattice constant mismatch with the substrate, forming a gate dielectric layer on the buffer layer, forming a gate electrode layer on the gate dielectric, patterning the gate dielectric layer and gate electrode layer to form a gate dielectric and a gate electrode, respectively, forming a spacer on a sidewall of the gate, recessing a portion of the buffer layer not underlying the gate and spacer and thus forming a recess, and forming a source/drain region substantially aligned with the spacer. The semiconductor device may be a pMOS device wherein the recess has a depth of less than about 50 nm. The semiconductor device may also be an nMOS device wherein the recess has a depth of between about 2 nm and about 50 nm.

The recess may extend into the semiconductor substrate, preferably below the gate dielectric for less than about 30 nm.

The method may further comprise forming a semiconductor-capping layer having a smaller lattice constant than the buffer layer between the buffer layer and the gate oxide. If the semiconductor device is a pMOS device, the semiconductor-capping layer preferably has a thickness of between about 0.5 nm and about 20 nm. If the semiconductor device is an nMOS device, the semiconductor-capping layer preferably has a thickness of between about 0.6 nm and 25 nm. Preferably, the semiconductor-capping layer for a pMOS device has a thickness of less than a thickness of a semiconductor-capping layer for an nMOS device.

In the embodiments of the present disclosure, due to the lattice constant difference, the semiconductor-capping layer has inherent tensile strain and the buffer layer has inherent compressive strain. Performance of both pMOS and nMOS devices is improved by hybrid strains of tensile strain and compressive strain.

In accordance with one aspect of the present disclosure, the semiconductor device includes a gate, including a gate electrode and a gate dielectric underlying the gate electrode, a spacer formed on a sidewall of the gate electrode and the gate dielectric, a buffer layer on a semiconductor substrate, wherein the buffer layer has a first portion underlying the gate dielectric and the spacer and a second portion adjacent the spacer, wherein the top surface of the second portion of the buffer layer is recessed below the top surface of the first portion of the buffer layer, and a source/drain region substantially aligned with the spacer. The buffer layer preferably has a greater lattice constant than the underlying semiconductor substrate. The semiconductor device may further include a semiconductor-capping layer between the buffer layer and the gate dielectric, wherein the semiconductor-capping layer has a smaller lattice constant then the buffer layer.

In accordance with another aspect of the present disclosure, the second portion of the buffer layer is removed and a recess is formed in the semiconductor substrate under the second portion of the buffer layer.

In accordance with yet another aspect of the present disclosure, the semiconductor-capping layer for pMOS devices is thinner than the semiconductor-capping layer for nMOS devices in order to improve the device performance.

What is claimed is:

1. A method comprising:
    forming over a semiconductor substrate a buffer layer having a lattice constant mismatch with the semiconductor substrate;
    forming a semiconductor-capping layer over the buffer layer, wherein the semiconductor-capping layer has a lattice constant smaller than a lattice constant of the buffer layer;
    forming a gate dielectric layer over the buffer layer;
    forming a gate electrode layer over the gate dielectric layer;
    patterning the gate dielectric layer and the gate electrode layer to form the gate dielectric and the gate electrode, respectively;
    etching a semiconductor layer underlying the gate dielectric using the gate electrode and the gate dielectric as an etching mask;
    after the etching the semiconductor layer, forming a gate spacer on sidewalls of the gate dielectric and the gate electrode, wherein a bottom surface of the gate spacer is in contact with a top surface of the semiconductor-capping layer, and wherein the gate spacer extends below the gate dielectric;
    recessing a portion of the buffer layer to form a recess, wherein during the recessing, the gate electrode and the gate spacer are used as an etching mask; and
    forming a source/drain region adjacent to the gate spacer.

2. The method of claim 1, wherein the source/drain region, the gate dielectric, and the gate electrode are comprised in a P-type Metal Oxide Semiconductor (PMOS) device, and wherein the recess has a depth smaller than about 50 nm.

3. The method of claim 1, wherein the source/drain region, the gate dielectric, and the gate electrode are comprised in an N-type Metal Oxide Semiconductor (NMOS) device, and wherein the recess has a depth between about 2 nm and about 50 nm.

4. The method of claim 1, wherein the recess extends into the semiconductor substrate.

5. The method of claim 1 further comprising, before the recessing the buffer layer, recessing the semiconductor-capping layer to form the recess, wherein the recess penetrates through the semiconductor-capping layer.

6. The method of claim 1, wherein the forming the source/drain region comprises an implantation.

7. The method of claim 1, wherein the forming the source/drain region comprises growing the source/drain region in the recess.

8. A method comprising:
performing a first epitaxy to grow a buffer layer over a semiconductor substrate, wherein the buffer layer has a lattice constant greater than a lattice constant of the semiconductor substrate;
performing a second epitaxy to grow a semiconductor-capping layer over the buffer layer, wherein the semiconductor-capping layer has a lattice constant smaller than the lattice constant of the buffer layer;
forming a gate stack comprising a gate dielectric and a gate electrode over the semiconductor-capping layer;
forming a gate spacer on a sidewall of the gate stack, wherein a bottom surface of the gate spacer is in contact with a first top surface of the semiconductor-capping layer, and wherein the bottom surface of the gate spacer is lower than a second top surface of the semiconductor-capping layer;
etching the semiconductor-capping layer and the buffer layer to form a recess, wherein the gate stack and the gate spacer are used as an etching mask; and
forming a source/drain region adjacent to the gate spacer.

9. The method of claim 8, wherein after the etching, the recess extends into the buffer layer, with a bottom portion of the buffer layer not etched.

10. The method of claim 8, wherein after the etching, the recess extends into the semiconductor substrate.

11. The method of claim 8, wherein the source/drain region has a top surface lower than a top surface of the semiconductor-capping layer and higher than a top surface of the buffer layer.

12. The method of claim 8, wherein the source/drain region has a top surface lower than a top surface of the buffer layer.

13. The method of claim 8, wherein the forming the source/drain region comprises an implantation.

14. The method of claim 8, wherein the forming the source/drain region comprises growing the source/drain region in the recess.

15. A method comprising:
performing an epitaxy to grow a buffer layer over a semiconductor substrate, wherein the buffer layer has a lattice constant greater than a lattice constant of the semiconductor substrate, and wherein the buffer layer consists of a single semiconductor layer;
forming a gate stack comprising a gate dielectric and a gate electrode over the buffer layer, wherein the gate dielectric comprises a bottom surface contacting a top surface of the buffer layer;
forming a gate spacer on a sidewall of the gate stack;
etching the buffer layer to form a recess, wherein the gate stack and the gate spacer are used as an etching mask; and
forming a source/drain region adjacent to the gate spacer.

16. The method of claim 15, wherein a bottom surface of the gate spacer is in contact with a top surface of the buffer layer.

17. The method of claim 15, wherein the source/drain region has a top surface lower than a top surface of the buffer layer and higher than a bottom surface of the buffer layer.

18. The method of claim 15, wherein the source/drain region has a top surface lower than a top surface of the buffer layer.

19. The method of claim 15, wherein the buffer layer is formed of a homogeneous material, with a bottom surface and a top surface of the homogeneous material in contact with the semiconductor substrate and the gate dielectric, respectively.

20. The method of claim 15, wherein no additional semiconductor layer different from the buffer layer is formed between the buffer layer and the gate dielectric.

* * * * *